United States Patent [19]

Aklufi et al.

[11] Patent Number: 5,023,056
[45] Date of Patent: Jun. 11, 1991

[54] PLASMA GENERATOR UTILIZING DIELECTRIC MEMBER FOR CARRYING MICROWAVE ENERGY

[75] Inventors: Monti E. Aklufi; David W. Brock, both of San Diego, Calif.

[73] Assignee: The United States of America as represented by the Secretary of the Navy, Washington, D.C.

[21] Appl. No.: 457,431

[22] Filed: Dec. 27, 1989

[51] Int. Cl.⁵ ............................................. B01J 19/08
[52] U.S. Cl. .................................... 422/186; 427/38; 219/10.55 R; 204/157.43
[58] Field of Search .......................... 422/186, 186.3; 204/157.43; 219/10.55 R, 10.55 A; 427/38, 45.1

[56] References Cited

U.S. PATENT DOCUMENTS

| | | | |
|---|---|---|---|
| 4,039,416 | 8/1977 | White | 204/192 N |
| 4,339,326 | 7/1982 | Hirose et al. | 204/298 |
| 4,476,098 | 10/1984 | Nakamori et al. | 422/140 |
| 4,504,518 | 3/1985 | Ovshinsky et al. | 427/38 |
| 4,522,674 | 6/1985 | Ninomiya et al. | 156/345 |
| 4,569,738 | 2/1986 | Kieser et al. | 204/173 |
| 4,686,113 | 8/1987 | Delfino et al. | 427/45.1 |
| 4,715,937 | 12/1987 | Moslehi et al. | 204/177 |

FOREIGN PATENT DOCUMENTS 59-63732  4/1984  Japan .

OTHER PUBLICATIONS

Aklufi, M. E. et al., Diamond Growth Using Plasmas Formed with Dielectrically Guided Microwaves, pp. 114-121, May 7-12 1989, Los Angeles, CA.
Kamo, M. et al., Diamond Synthesis from Gas Phase in Microwave Plasma (possibly published in "Crystal Growth"), pages unknown, possibly 1982, place of publication unknown.
Publication/Advertisement, Microwave Plasma Systems for Diamond Film Research, May 16, 1988, Nov. 15, 1988, Jan. 15, 1989.

Primary Examiner—Deborah L. Kyle
Assistant Examiner—J. Woodrow Eldred
Attorney, Agent, or Firm—Harvey Fendelman; Thomas Glenn Keough; Peter A. Lipovsky

[57] ABSTRACT

A plasma generator utilizes a dielectric member for carrying microwave energy from a microwave source directly into the hot zone of a thermally heated semiconductor process reaction chamber. The member carries the microwave energy much like fiber optics carries light so that the microwave energy may be delivered to and emitted at a specific preselected position within the chamber. A plasma can be formed and located directly over or near substrates so that a more highly controlled deposition and/or etching process may take place.

68 Claims, 4 Drawing Sheets

PLASMA GENERATOR UTILIZING DIELECTRIC MEMBER FOR CARRYING MICROWAVE ENERGY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention pertains broadly to the field of plasma generating devices such as those used in the semiconductor processing industry. More particularly, but without limitation thereto, the invention relates to the delivery of ionizing energy within a semiconductor processing system so that a plasma is induced at a desired location within the system.

2. Description of the Prior Art

The process of forming plasmas is well known to the semiconductor industry. The plasmas facilitate the deposition of selected materials upon semiconductor substrates as well as serve to etch or remove selected materials from surfaces. In prior art systems, plasmas are typically generated by way of radio frequency (RF) and microwave discharges.

In typical radio frequency discharge devices, a plasma is formed by coupling RF energy to a gas via electrodes, coils or plates. In common microwave discharge devices, microwave energy is coupled to a gas by way of a hollow waveguide and a resonant cavity.

In microwave discharge plasma generating devices, control of plasma location, intensity and energy has been limited. This has resulted in non-uniform plasma processing affecting both the uniformity and yield of electronic devices processed.

In these devices, microwaves are generated in a section of the processing equipment that is remote from the location of the substrate to be processed. In order to transport the microwaves to the substrate, a hollow metal waveguide is coupled between the source of microwaves and the reaction chamber in which the substrate is contained.

In some microwave discharge devices, plungers are used to dimensionally tune a reaction chamber to resonance so that a plasma becomes positioned in an area in which the substrate lies. The size of the resulting plasma is limited and the plasma is not entirely uniform.

In semiconductor processes requiring uniform heating it is often desirable that a uniform plasma coincide with an area or zone of uniform heating. Long tubular reaction vessels with heating elements surrounding the vessel are often used to form the zone of uniform heating.

With such a set-up, a central heating zone is created within the vessel with separate heating zones on either side of the vessel. The central area of uniform heating, otherwise known as a "hot zone", usually lies equidistant between the ends of the chamber. Because of the often high temperatures involved and because of mechanical and power supply constraints, the source of microwaves, including a signal generator, driver, amplifier, etc., generally must be located a safe distance from the heated reaction chamber.

In cases in which heating elements surround the length of the chamber, the microwaves must be introduced at one end or the other of the chamber. As typical heated chambers run as long as six feet, a minimum of three feet will exist between the central hot zone of the chamber and the entrance of the microwave energy.

If microwave energy could be carried directly to the reaction chamber's hot zone, a plasma could be formed within the uniformly heated area of the chamber.

If these microwaves were transported to the hot zone by the traditional hollow metal waveguide, contamination of the plasma process would occur as the metal waveguide would eventually degrade in the elevated temperatures of the heated reaction chamber.

SUMMARY OF THE INVENTION

The present invention is a method and apparatus of delivering microwave energy directly into a hot zone of semiconductor processing equipment. The microwave energy creates a plasma that may be used, for example, to form thin films on selected substrates, remove unwanted films from surfaces or to etch surfaces. The invention may be utilized in a variety of processes in which a plasma is required, including those with or without heating stages; however, the invention is particularly useful in those semiconductor production processes that require substrates to be heated to elevated temperatures.

The invention incorporates a high-temperature-resistant solid rod or thick-walled tube dielectric member that carries microwave energy from a microwave source to a preselected position within a semiconductor process reaction chamber. The microwave energy is "carried" much as light is carried in fiber optic elements so that the microwave energy may be carried to and emitted from a specific preselected location within the semiconductor processing equipment. Confining a plasma in this way permits greater uniformity in semiconductor production by enabling a uniform plasma to be formed directly within the hot zone of a reaction chamber. The confinement of the plasma also prevents the plasma from contacting undesirable areas of the processing equipment where the plasma may react.

The dielectric member of the invention is not limited to use in heated plasma processes but is considered to be of high utility in those processes where it is desired to coincide a plasma with a uniformly heated temperature zone. As aforesaid, these processes typically utilize a reaction chamber that is six or more feet long to enable a uniform zone of heating or "hot zone" to be formed at the center of the chamber.

Using conventional microwave guide techniques may cause a plasma to form outside of the hot zone of the chamber so that the highest intensity of the plasma may not coincide with the chamber's hot zone. As discussed this may lead to non-uniform processing and products. Conventional metal waveguides further cannot withstand the often elevated temperatures of heated reaction chambers where temperatures may approach as high as approximately 1300° Celsius. Introducing microwave energy into the chamber, such as may be done with conventional schemes, may cause the plasma to be generated in an undesirable area, such as near the chamber's entrance, thereby posing a possible reaction within the chamber that may contaminate the semiconductor process.

According to the invention, microwave energy is introduced into a semiconductor processing chamber by a high-temperature-resistant dielectric member such as a rod of a cylindrical or rectangular cross-section or a thick-walled tube of a wall thickness that is at least 20% of the diameter of the tube. The rod or tube may be made of a high-purity-semiconductor-grade fused silica, for example, to minimize contamination of the production process and to withstand reaction chamber temperatures.

The rod-shaped or tube-shaped dielectric member is transitioned to a hollow metal waveguide that is connected to a microwave source. The ratio of the dimensions of the dielectric rod or tube to the microwave wavelength is kept sufficiently large so that the dielectric member carries the microwave energy. To release the microwave energy at a preselected location within the chamber, the dielectric member is tapered in one of several ways.

The microwave energy is emitted at the tapered end of the member so that a plasma is confined to form around a periphery of the tapered end. By this design the plasma can be generated at a specific or preselected location within the reaction chamber.

To further confine the location of plasma generation, an electromagnetically-transparent inner chamber may be placed around the tapered dielectric member. The inner chamber and member are then inserted within the reaction chamber.

The pressure within the inner chamber is kept at atmospheric pressure while the pressure within the surrounding reaction chamber is reduced below atmospheric pressure, for example to 1 torr. The higher pressure within the inner chamber prevents a plasma from forming within this chamber. The plasma is instead confined to form within the low pressure reaction chamber and is further confined to form around the outside surface of the inner chamber about the region of microwave emission.

Further restriction and control of the plasma formation may be had by placing or tilting the member towards one side of the inner chamber so that the plasma forms in an area where the member is closest to the inner chamber. An alternative embodiment includes a tapered member with a corresponding tapered inner chamber that closely coincides with the member's tapered end. The plasma is confined to form about the sides of the inner chamber's tapered ends.

If it is desired to focus the microwaves emitted from the dielectric member at a location distant from the member, a lens may be used. The lens is placed between the member and the desired location so that the emitted microwaves are focused, forming a plasma at a desired location. The lens allows a plasma to be formed at the focal point of the lens so that the plasma does not touch any part of the processing chamber or equipment, thereby minimizing the possibility of contamination.

OBJECTS OF THE INVENTION

It is an object of the invention to provide an improved plasma generating device.

Another object of the invention is to provide an improved plasma generator for semiconductor processing.

Yet a further object of the invention is to provide an improved plasma generating device for forming a plasma at a preselected location within semiconductor processing equipment.

Another object of the invention is to provide an improved plasma generator for carrying electromagnetic energy to a preselected location within a reaction chamber of a semiconductor processing system so that a plasma can be formed at the preselected location within the reaction chamber.

Yet another object of the invention is to provide for the carrying of microwave energy to a semiconductor processing reaction chamber's hot zone so that the microwave energy is released within the hot zone to form a plasma of a gas located within the hot zone of the reaction chamber.

Other objects, advantages and new features of the invention will become apparent from the following detailed description of the invention when considered in conjunction with the accompanied drawings.

BRIEF DESCRIPTION OF THE DRAWINGS

FIGS. 2A and 2B show dielectric rods of circular cross-sections having tapered ends of various configurations. FIG. 2C is a tapered dielectric tube of thick walled construction. FIG. 2D is a tapered dielectric rod having a rectangular cross-section.

DESCRIPTION OF THE PREFERRED EMBODIMENT

Figure 1:
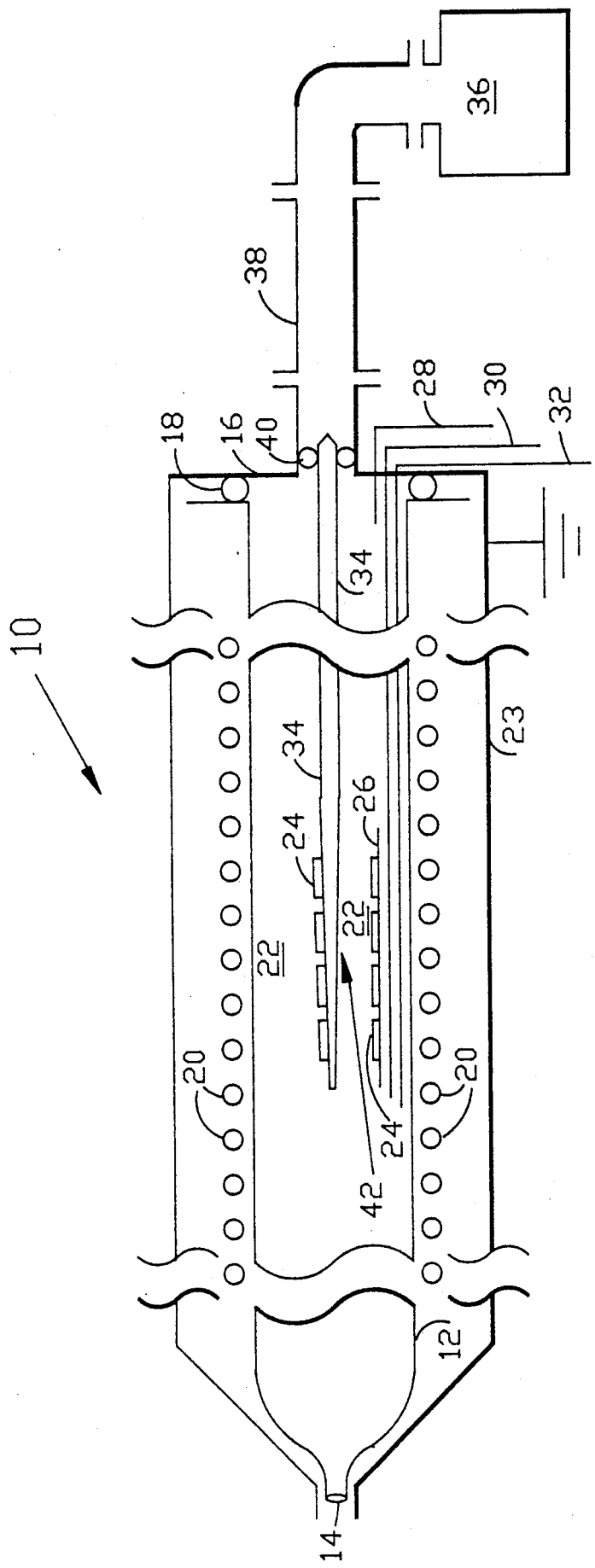
FIG. 1 is a diagrammatic representation of a plasma generating system according to the invention.

FIG. 1 is a diagrammatic representation of a plasma generator system 10 such as may be utilized in semiconductor production processing. System 10 includes a reaction chamber or vessel 12 which may, for example, be made of high purity fused silica. One end of chamber 12 reduces to a nozzle 14 to facilitate the connecting of a vacuum inducing mechanism to the chamber. At an opposite end of chamber 12 is a door 16 that is vacuum sealed to the chamber by way of seal 18. In the embodiment of the invention shown, chamber 12 is surrounded by heating elements 20 that, when energized, create a uniform hot zone 22 about the center of the chamber.

Heating elements 20 are conventional and may be resistance elements, for example, or may be high intensity light sources, for example, and can be designed to create a temperature climate that reaches as high as 1300° Celsius and that varies as little as one degree Celsius over the length of the hot zone. Heating elements 20 and reaction chamber 12 are surrounded by a microwave cavity 23 such as defined by a grounded radio frequency metal sleeve.

Plasma generating system 10 is shown loaded with sheets 24, such as semiconductor substrates. These substrates may be placed within chamber 12 onto a suitable platform, such as a boat 26, that can be made of high purity fused silica, for example, to avoid undesirable contamination of the plasma induced process. Sheets 24 may be placed in a variety of orientations including the horizontal orientation, shown, and may be disposed in a number of locations within chamber 12, as will be explained. When sheets of electrically conductive materials are used the sheets should be oriented perpendicular to the electric fields of the microwaves to permit the plasmas to reach the surface of the sheets. Additionally, in cases in which the sheets are placed on dielectric member 34, the sheet dimensions should be limited to less than one-half of the microwave wavelength used.

Plasma and ultraviolet forming gases may be piped into chamber 12 by way of conduit 28. Conduits 30 and 32 provide passages by which deposition or etching gases may be introduced into chamber 12 so as to "vent" beneath substrates 24 located on boat 26 and member 34.

In accordance with the invention, electromagnetic energy in the form of microwaves is carried directly into hot zone 22 of chamber 12 by way of a dielectric member 34 to be further explained.

This microwave energy is supplied to chamber 12 by a conventional microwave source 36, such as one incorporating a traveling wave tube. The microwaves are transported from source 36 to dielectric member 34 through a transitioning hollow metal waveguide 38. Waveguide 38 is attached to door 16 and is sealed to member 34 by a vacuum seal 40. As shown, the waveguide may actually consist of several sections.

Referring again to FIG. 1, sheets 24 may be placed directly on top of dielectric member 34 as well as remote from the member, such as those placed upon boat 26.

In operation, film deposition is made possible by first loading substrates 24 into chamber 12 through door 16. These substrates may include conductors, such as molybdenum; semiconductors, such as silicon; and insulators, such as sapphire, for example. Chamber 12 is then evacuated through nozzle 14 by a conventional evacuating mechanism such as a vacuum pump, not shown. The substrates 24 are uniformly heated to semiconducting processing temperatures by energizing heating elements 20.

Upon chamber 12 reaching a suitably selected vacuum, plasma and ultraviolet producing gas or gas mixtures are introduced into chamber 12 by way of tube 28. These gases, for example, may include argon (Ar) or a mixture of hydrogen ($H_2$) and argon.

Microwave energy is then carried into chamber 12 by member 34 and is released about tapered end 42 of the member to form a plasma about this tapered area.

Member 34 is a high-temperature-resistant dielectric such as high purity semiconductor grade fused silica. The ratio of the member's minimum width to the microwave wavelength must be sufficiently large to enable the member to act as an efficient waveguide and thus carry the microwave energy into reaction chamber 12. For example, a 10 Gigahertz microwave source coupled to a quartz dielectric rod of 25 millimeter diameter will transfer most of the microwave energy into chamber 12. Dielectric member 34 will be described further.

In silicon technology, deposition gases such as silane ($SiH_4$) and oxygen ($O_2$), for example, are introduced individually into the chamber by way of tubes 30 and 32 so that these gases vent beneath the sheets 24.

In cases in which etching is desired, etchant gases, such as boron trichloride ($BCl_3$) and chlorine ($Cl_2$), may be introduced through tubes 30 and 32 to etch material on the chamber walls or the substrates.

Those skilled in the art will realize that by using this system, depositions of semiconducting materials such as, for example, germanium, silicon and diamond as well as depositions of insulating materials such as, for example, silicon dioxide and silicon nitride can be made. It should be noted that deposition of conducting or semiconducting films may be accomplished in regions downstream from the plasma. "Downstream" is meant to denote an area between end 42 of member 34 and nozzle 14 of chamber 12 that may still be within hot zone 22 of the chamber.

Referring now to FIGS. 2A–D there are shown various embodiments of dielectric members as may be utilized with the invention. The dielectric members shown in FIG. 2 are composed of materials selected to permit efficient transfer of microwave energy, minimize undesirable contamination of the deposition/etching process and withstand elevated hot zone temperatures, some temperatures approaching as high as 1300° Celsius. Some materials considered suitable for this purpose include, for example, fused silica, quartz, refractory metal oxides and sapphire.

Figure 2A:
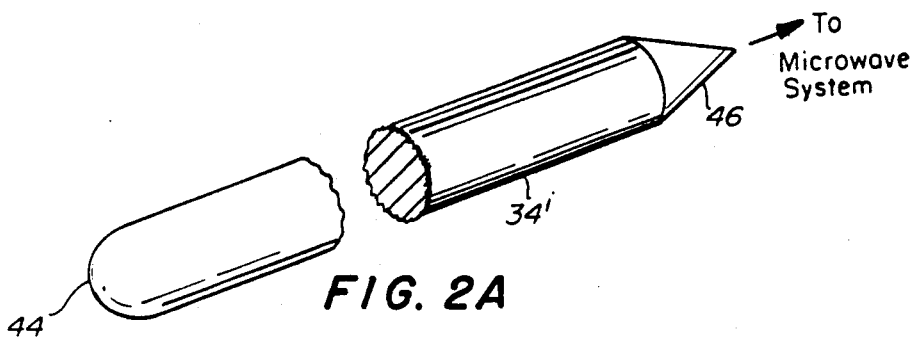
FIGS. 2A-D show various embodiments of the dielectric member as may be utilized in the invention.

FIG. 2A depicts a rod shaped dielectric member $34^i$ having a convex-shaped tapered end 44 and a conical-shaped end 46. End 46 is inserted within hollow waveguide 38 of FIG. 1 to provide a smooth transition of the microwaves emanating from source 36 to the dielectric member. The convex-shaped tapered end 44 of dielectric rod $34^i$ allows the microwaves to be released from this end of the rod.

By utilizing a dielectric member such as that shown in FIG. 2A, the release of microwave energy may be designed to take place at a preselected position within a semiconductor process reaction chamber. This release can be used to initiate a plasma to form about the periphery of member $34^i$ at end 44 thereof so that a region of high intensity plasma may be generated directly in a hot zone of a semiconductor processing reaction chamber, for example. Further, by carrying microwave energy through the dielectric member and by emitting the energy at the member's tapered end, the plasma may be confined to a specific area of the chamber, thereby minimizing the contact of the plasma with portions of the chamber that might, upon reacting with the plasma, cause contamination of any semiconductor substrates.

To form a plasma along a larger portion of the length of the dielectric member of the invention, the tapered end of the member may be lengthened or the microwave frequency may be reduced or the microwave power may be increased or a combination of these so that more microwave energy is released along a greater length of the member.

Figure 2B:
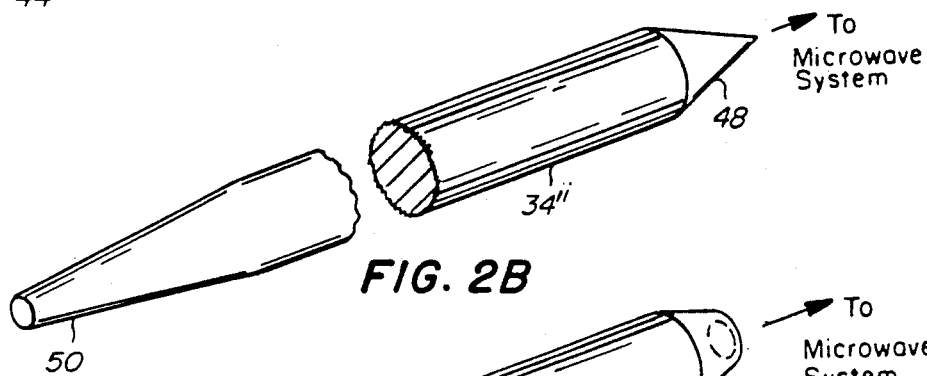

Referring now to FIG. 2B another embodiment of a dielectric member such as may be utilized with the invention is shown. Dielectric member $34^{ii}$ of FIG. 2B has a conical end 48 through which microwave energy from a conventional microwave source is conducted as well as an extended conical end 50 at which the microwave energy is released from the member.

Figure 2C:
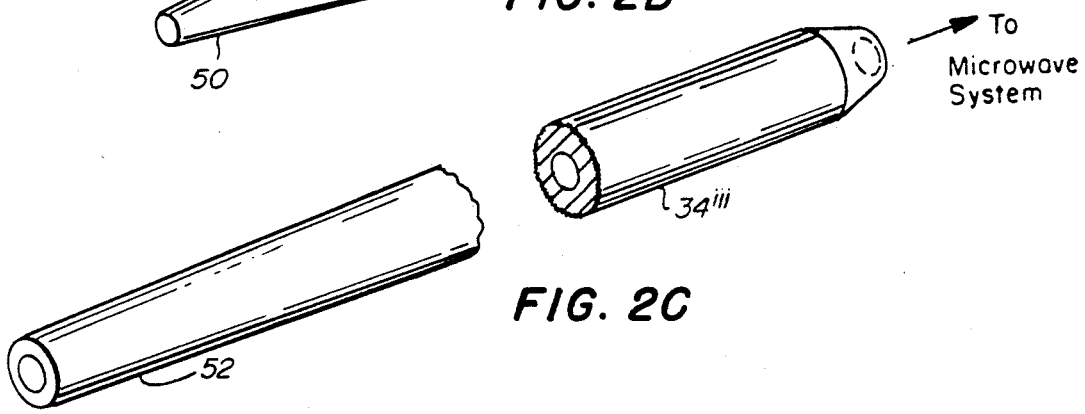

In FIG. 2C a dielectric member $34^{iii}$ is shown having the configuration of a taper-ended thick-walled tube. To serve as an adequate carrier of microwave energy, the thick-walled tube should have walls that are at least 20% as thick as the diameter of the tube. The dielectric member $34^{iii}$ of FIG. 2C releases microwave energy about tapered end 52 of the member. In cases in which this member is used, air passage through this member must be blocked to prevent any vacuum inducing mechanism from drawing air from electromagnetic wave source 36. An inner chamber surrounding the member, to be discussed, is one way by which this may be accomplished, but those skilled in the applicable arts will realize that other ways of accomplishing this result exist.

Figure 2D:
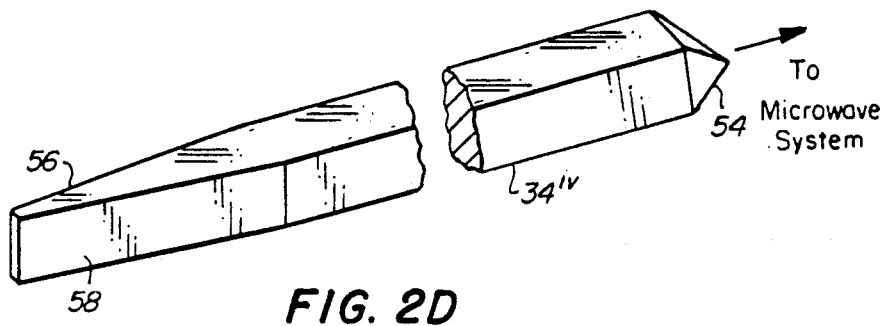

Referring to FIG. 2D a rod-shaped dielectric member of rectangular cross-section $34^{iv}$ is shown. The dielectric member of FIG. 2D has a pyramidal end 54 that is inserted within the transitioning waveguide 38 of FIG. 1. At an opposite end are opposing tapered surfaces 56 and 58. Like the dielectric members of FIGS. 2A-C, dielectric member $34^{iv}$ "releases" microwave energy, but in this case the release is primarily confined to faces 56 and 58 of the member.

Figure 3A:
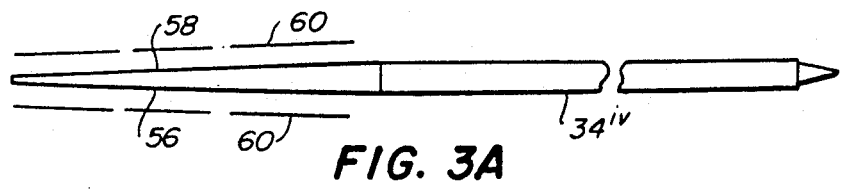
FIGS. 3A and 3B show the dielectric member of FIG. 2D as may be utilized with surfaces upon which deposition and/or etching are desired to take place.
Figure 3B:
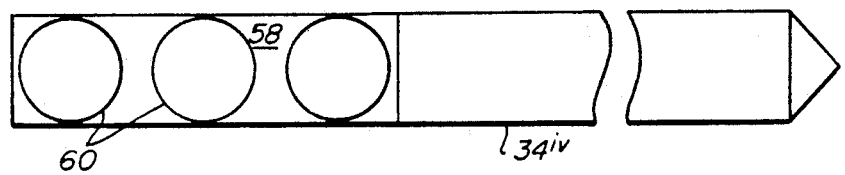

FIGS. 3A and 3B show, for purposes of illustration, sheets 60, such as semiconductor wafers, positioned about the dielectric member $34^{iv}$ of FIG. 2D. As dielectric member $34^{iv}$ is designed to release microwave energy from surfaces 56 and 58, sheets 60 may be placed near these surfaces so that the sheets may be inside or outside of the plasma formed by the microwaves release by the member. Member $34^{iv}$ is designed to generate plasmas along surfaces 56 and 58 of the member to place a uniform deposit upon surfaces exposed to these plasmas.

Figure 4:
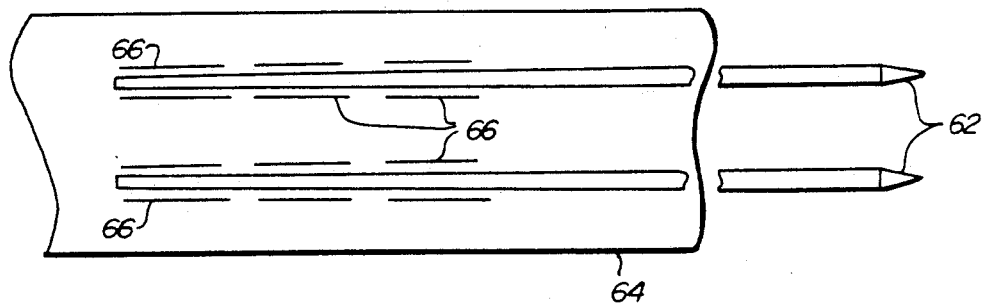
FIG. 4 illustrates how at least two dielectric members may be utilized within a single reaction chamber.

In FIG. 4 an embodiment of the invention is shown in which a plurality of dielectric members 62 are utilized within a single reaction chamber 64. This embodiment permits an increase in the number of sheets 66 upon which deposition and/or etching is desired.

Figure 5:
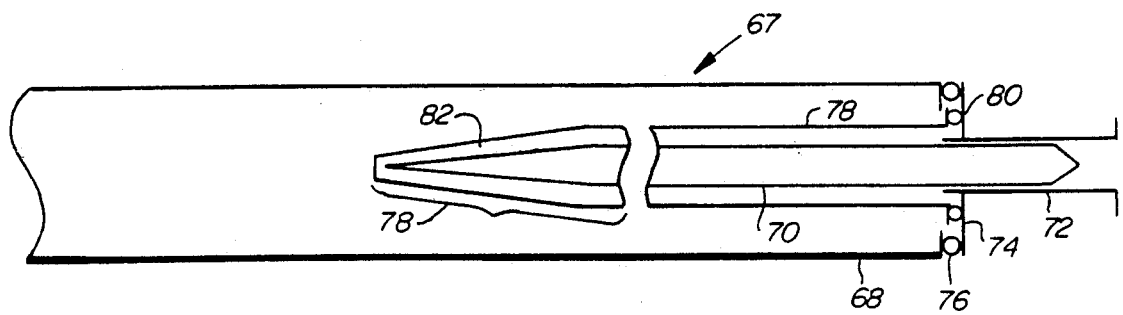
FIG. 5 is a partial view of a plasma generating system having a reaction chamber in which an inner chamber encloses a dielectric member of the invention.

FIG. 5 is a partial view of a plasma generating system 67 having a reaction chamber 68 such as that which may be used in semiconductor processing. Inserted within reaction chamber 68 is a dielectric member 70 that is transitioned to a microwave source by a hollow metal waveguide 72. Waveguide 72 extends within chamber 68 to additionally serve as an electromagnetic field confinement shield to prevent microwaves from being released and forming a plasma near chamber door 74. This extension of the waveguide is applicable not only to the embodiment of the invention shown in FIG. 5, but to any embodiment of the invention in which additional confinement of transmitted microwaves is desired. In FIG. 5, the waveguide 72 is attached to chamber door 74 with chamber door 74 being sealed to chamber 68 by vacuum seal 76.

Referring again to FIG. 5, an inner chamber 78 is placed around dielectric member 70 and is vacuum sealed to chamber door 74 by vacuum seal 80 so that the interior of chamber 78 is isolated from that of reaction chamber 68. Inner chamber 78 may be made of fused silica, for example, to provide electromagnetic transparency as well as to pose minimal processing contamination problems. As shown in FIG. 5, dielectric member 70 traverses chamber door 74 and transitionary hollow waveguide 72 and extends into the inside of inner chamber 78.

In operation, the interior of inner chamber 78 is maintained at atmospheric pressure with the interior of chamber 68 being placed under a vacuum. The atmospheric pressure surrounding dielectric member 70 prevents plasma from forming directly about the member, however the release of microwave radiation from tapered end 82 of member 70 will cause a plasma to be formed about the periphery of inner chamber 78 proximate to tapered end 82 of the dielectric member.

FIG. 5, besides illustrating the use of an inner chamber, illustrates how the inner chamber can be tapered to conform to the dielectric member so that the plasma generated will be located at the tapered surfaces of the inner chamber.

Figure 6:
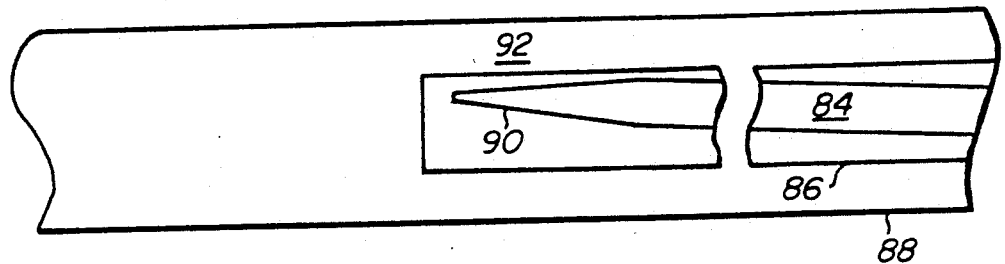
FIG. 6 is a view like that of FIG. 5 showing a dielectric member of the invention tilted within a surrounding inner chamber.
Figure 7:
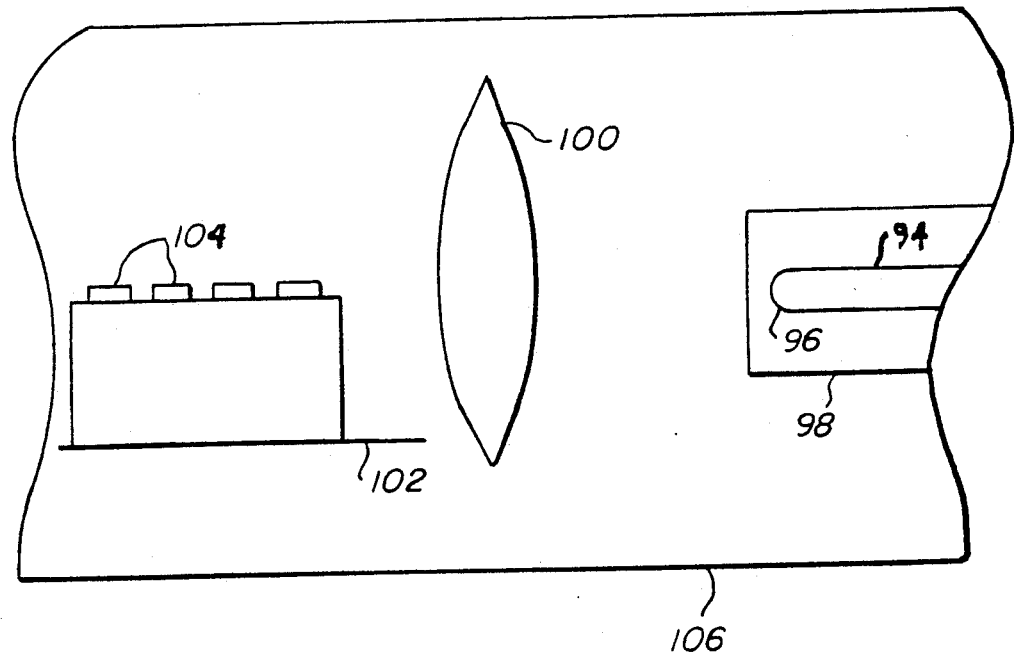
FIG. 7 illustrates how a lens can be used to focus microwaves around or near a substrate to be processed.

It should be noted that the placing of a dielectric member within an inner chamber is applicable not only to the embodiment of the invention shown in FIG. 5 but is equally applicable to any of the other forms of the invention as well. FIGS. 6 and 7 show some examples of this.

In FIG. 6 a partial embodiment similar to that shown in FIG. 5 is illustrated in which a dielectric member 84 is canted or tilted within an inner chamber 86, both member 84 and 86 being disposed within a reaction chamber 88. Like the embodiment illustrated if FIG. 5, the interior of inner chamber 86 is kept at atmospheric pressure with the interior of reaction chamber 88 being kept under a vacuum. This pressure arrangement confines plasma formation to occur about the periphery of inner chamber 86. The tilting of dielectric member 84 within inner chamber 86 permits plasma formation to be further confined to a surface of inner chamber 86 that lies closest to dielectric member 84, this surface being in the general area indicated by reference numeral 92. The tilting of member 84 within inner chamber 86 permits even greater control over plasma location. Additionally, in cases in which substrates to be processed are placed on top of inner chamber 86 at location 92, the substrate dimensions should be limited to less than one-half of the microwave wavelength used.

Referring now to FIG. 7 a partial view of yet another embodiment of the invention is shown. A dielectric member 94 having a convex-shaped end 96 is inserted within an inner chamber 98. A dielectric lens 100, mounted on a boat 102, is located between end 96 of member 94 and sheets 104 such as semiconductor substrates. Lens 100 is used to focus microwaves released from member 94 upon a preselected location within reaction chamber 106, in this case above substrates 104.

FIGS. 5, 6 and 7 illustrate how various shaped dielectric members may be used in conjunction with inner chambers and focusing lenses so that generation of a plasma can even be further confined. It should be noted that the lens, the shape of the dielectric member, the inner chamber or any of these may be changed in a number of ways other than those shown so as to alter the position of the plasma as well as to produce desirable plasma geometries.

The dielectric member of the invention has been largely described as used in conjunction with a microwave energized, thermally heated reaction chamber, however the dielectric member is by no means limited to this setup. The dielectric member may be used in any scheme whereby it is desirable to generate a microwave induced plasma at a confined preselected location.

Though in many circumstances it is desirable to form a plasma at a position distant from a source of electromagnetic energy, the dielectric member of the invention is not limited solely to this purpose.

The various embodiments shown have been offered to facilitate an understanding the invention, but the invention should not be considered limited to these specific embodiments.

As many modifications and variations of the invention are possible in light of the above teachings, it should be understood that, within the scope of the appended claims, the invention may be practiced otherwise than as has been specifically described.

What is claimed is:

1. A system in which electromagnetic energy is used to generate a plasma from a gas comprising:
   a reaction chamber which is evacuated to less than ambient pressure and into which said gas is introduced; and
   a nonconductive member projecting within said reaction chamber, said nonconductive member for carrying said electromagnetic energy and for emitting said electromagnetic energy so that a plasma is formed from said gas.

2. The system of claim 1 in which said nonconductive member is tapered.

3. The system of claim 2 in which said electromagnetic energy is microwave energy.

4. The system of claim 3 further including a substantially electromagnetically transparent inner chamber disposed within said reaction chamber around said nonconductive member.

5. The system of claim 4 further including an electromagnetic confinement shield extending from a source of said electromagnetic energy into said reaction chamber and covering a portion of said nonconductive member at an area where said nonconductive member enters said reaction chamber.

6. The plasma generator system of claim 4 in which the shape of said inner chamber substantially conforms to the shape of said nonconductive member.

7. The system of claim 4 in which said nonconductive member is tilted towards one side of said inner chamber.

8. The system of claim 2 in which said nonconductive member has a substantially circular cross-section.

9. The system of claim 2 in which said nonconductive member has a substantially rectangular cross-section.

10. The system of claim 2 in which said nonconductive member is a taper-ended thick-walled tube having a wall thickness that is at least two-tenths of a diameter of the tube.

11. The system of claim 2 in which said nonconductive member is comprised of a dielectric material.

12. The system of claim 11 in which said nonconductive member is comprised of fused silica.

13. The system of claim 11 in which said nonconductive member is comprised of a refractory metal oxide.

14. The system of claim 11 in which said nonconductive member is comprised of sapphire.

15. A plasma generator system comprising:
   means for defining a reaction chamber;
   means for evacuating said reaction chamber;
   means for introducing an ionizable gas into said chamber; and
   means for transmitting electromagnetic energy to a preselected position within said reaction chamber whereat said electromagnetic energy is emitted to form a plasma from said ionizable gas, said means including a nonconductive member that extends within said reaction chamber.

16. The plasma generator system of claim 15 in which said nonconductive member is a rod that is tapered at an end that extends into said reaction chamber.

17. The plasma generator system of claim 16 in which said electromagnetic energy is microwave energy.

18. The plasma generator system of claim 17 further including means disposed within said reaction chamber for defining an inner chamber around said nonconductive member, said inner chamber being substantially electromagnetically transparent and defining a volume maintained at atmospheric pressure.

19. The plasma generator system of claim 18 further including means for electromagnetically shielding said nonconductive member at an area where said nonconductive member enters said reaction chamber.

20. The plasma generator system of claim 19 in which said nonconductive member is canted towards one side of said inner chamber.

21. The plasma generator system of claim 19 further including means for heating said reaction chamber.

22. The plasma generator system of claim 21 in which heating said reaction chamber results in the formation of a hot zone within said reaction chamber in which the temperature thereof is less than 1000 degrees Celsius.

23. The plasma generator system of claim 22 in which said preselected position at which said electromagnetic energy is emitted is within said hot zone.

24. The plasma generator system of claim 21 in which heating said reaction chamber results in the formation of a hot zone within said reaction chamber in which the temperature thereof falls within the range of 1000 to 1300 degrees Celsius.

25. The plasma generator system of claim 24 in which said preselected position at which said electromagnetic energy is emitted is within said hot zone.

26. The system of claim 19 in which said nonconductive member is comprised of a dielectric material.

27. The system of claim 26 in which said nonconductive member has a cross-section that is substantially circular in shape.

28. The system of claim 26 in which said nonconductive member has a cross-section that is substantially rectangular in shape.

29. The plasma generator system of claim 25 in which said nonconductive member is a taper-ended tube having a wall thickness that is at least two-tenths of a diameter of said tube.

30. The plasma generator system of claim 19 in which said inner chamber is shaped to substantially conform to the shape of said nonconductive member.

31. An apparatus comprising:
   a reaction vessel;
   a heat source for heating said reaction vessel;
   means for evacuating said vessel to a pressure below atmospheric pressure;
   a source of reactive gas in fluid communication with said reaction vessel so that said gas may be introduced into said vessel;
   a source of electromagnetic energy; and
   a dielectric member for carrying said electromagnetic energy to a preselected location within said reaction vessel and for releasing said electromagnetic energy at said preselected location so that a plasma is formed at said preselected location from said reactive gas.

32. The apparatus of claim 31 in which said electromagnetic energy is microwave energy.

33. The apparatus of claim 32 in which said dielectric member is a tapered rod that projects within said reaction vessel.

34. The apparatus of claim 33 in which said rod has a cross-section that is substantially circular.

35. The apparatus of claim 33 in which said rod has a cross-section that is substantially rectangular.

36. The apparatus of claim 32 in which said dielectric member is a tube having a wall thickness that is at least two-tenths of the diameter of said tube.

37. The apparatus of claim 33 in which said preselected location within said reaction vessel is heated to a temperature of less than approximately 1000 degrees Celsius.

38. The apparatus or claim 37 in which said preselected location within said reaction vessel is heated to maintain a temperature variance of approximately plus or minus one-half of one degree Celsius.

39. The apparatus of claim 33 in which said preselected location within said reaction vessel is heated between a temperature greater than about 1000 degrees Celsius and less than about 1300 degrees Celsius.

40. The apparatus of claim 39 in which said preselected location within said reaction vessel is heated to maintain a temperature variance of approximately plus or minus one-half of one degree Celsius.

41. A method for generating a plasma comprising the steps of:
evacuating an enclosed chamber to a pressure that is less than atmospheric pressure;
introducing a plasma producing gas into said enclosed chamber;
establishing a source of electromagnetic energy; and
carrying said electromagnetic energy in a dielectric member to a preselected position in said chamber where said energy is released to generate a plasma from said plasma producing gas.

42. The method of claim 41 in which the step of carrying said electromagnetic energy includes carrying said electromagnetic energy in a dielectric rod.

43. The method of claim 41 in which the step of carrying said electromagnetic energy includes carrying said electromagnetic energy in a dielectric tube having a tapered end extending into said enclosed chamber, said tube having a wall thickness that is at least 20 percent of the diameter of said tube.

44. The method of claims 42 or 43 further including the step of heating said enclosed chamber to form a hot zone therein of a preselected temperature.

45. The method of claim 44 in which said preselected position is within said hot zone.

46. The method of claim 45 in which said preselected temperature of said hot zone is less than 1000 degrees Celsius.

47. The method of claim 44 in which the step of heating said enclosed chamber creates a temperature therein that varies by approximately no more than one degree Celsius.

48. The method of claim 45 in which said preselected temperature of said hot zone is greater than 1000 degrees Celsius and less than 1300 degrees Celsius.

49. The method of claim 48 in which the step of heating said creates a temperature therein that varies by approximately no more than one degree Celsius.

50. A process comprising the steps of:
evacuating a reaction chamber to less than fourteen and seven tenths pounds per square inch pressure;
heating said chamber to form a hot zone therein of a preselected temperature;
introducing a plasma producing gas into said chamber; and
radiating the plasma producing gas within said hot zone with electromagnetic energy to form a plasma within said hot zone of said plasma producing gas, said step of radiating including carrying said electromagnetic energy to said hot zone by way of a nonconductive member.

51. The process of claim 50 in which said nonconducting member is a dielectric rod.

52. The process of claim 50 in which said nonconducting member is a dielectric thick-walled tube having a tapered end extending into said reaction chamber with said tube having a diameter and a tube-wall thickness that is at least two tenths as wide as said diameter and sealed at both ends.

53. The process of claim 51 or 52 further including the steps of:
placing a substrate within said hot zone of said reaction chamber; and
introducing a deposition gas containing a predetermined component into said chamber so that said predetermined component is ionized and is deposited upon said substrate.

54. The process of claim 53 further including the step of:
introducing a gas into said chamber that reacts with said predetermined component to remove material from said predetermined component.

55. A microwave energy plasma generator comprising:
a chamber which is evacuated and into which a gas is introduced;
a heater operably coupled to said chamber for heating at least a portion of said chamber to approximately 800 degrees Celsius to as high as approximately 1400 degrees Celsius; and
a nonconducting dielectric member projecting within said portion of said chamber for carrying said microwave energy within said chamber and for emitting said microwave energy to form a plasma from said gas within said portion of said chamber about said nonconducting dielectric member.

56. The generator of claim 55 in which said nonconducting dielectric member is a rod.

57. The generator or claim 56 in which said rod has a substantially circular cross-section.

58. The generator or claim 56 in which said rod has a substantially rectangular cross-section.

59. An apparatus comprising:
a reaction vessel;
a substantially electromagnetically transparent sealed inner chamber disposed within said reaction vessel, said inner chamber defining a volume maintained at atmospheric pressure;
means for evacuating said reaction vessel to a pressure below atmospheric pressure;
a source of ionizable gas in fluid communication with said reaction vessel so that said gas may be introduced into said vessel:
a source of electromagnetic energy;
means for carrying said electromagnetic energy into said inner chamber;
means for releasing said electromagnetic energy within said inner chamber; and
means for focusing said released electromagnetic energy at a preselected location within said reaction vessel so that a plasma is formed at said preselected location from said reactive gas.

60. The apparatus of claim 59 in which said electromagnetic energy is microwave energy.

61. The apparatus of claim 60 in which said means for carrying said electromagnetic energy and said means for releasing said electromagnetic energy comprises a dielectric member.

62. The apparatus or claim 61 in which said dielectric member has a convex shaped end that projects within said inner chamber.

63. The apparatus or claim 62 in which said means for focusing said released electromagnetic energy includes a convex lens disposed between said dielectric member and said preselected location.

64. The apparatus or claim 63 further including means for heating said reaction vessel.

65. A plasma generator system comprising:
means for defining a reaction chamber;
means for evacuating said reaction chamber;
means for introducing an ionizable gas into said chamber; and
means comprising a solid material for propagating said electromagnetic energy within said solid material to a preselected position within said reaction chamber whereat said electromagnetic energy is emitted to form a plasma from said ionizable gas.

66. A plasma generator according to claim 65 in which said means comprising a solid material includes a member in the shape of a rod.

67. A plasma generator according to claim 65 in which said means comprising a solid material includes a member in the shape of a thick-walled tube having a diameter and a tube wall thickness that is at least two tenths as wide as said diameter.

68. A plasma generator according to claims 65, 66 or 67 in which said electromagnetic energy is microwave energy.

* * * * *